(12) United States Patent
Chen et al.

(10) Patent No.: US 7,794,260 B2
(45) Date of Patent: Sep. 14, 2010

(54) MOBILE PHONE AND MEMORY CARD FIXING DEVICE THEREOF

(75) Inventors: Yi-An Chen, Taipei (TW); Wen-Chih Wu, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 12/204,787

(22) Filed: Sep. 4, 2008

(65) Prior Publication Data
US 2009/0068874 A1    Mar. 12, 2009

(30) Foreign Application Priority Data
Sep. 6, 2007    (TW) ............... 96133222 A

(51) Int. Cl.
H01R 13/62    (2006.01)
(52) U.S. Cl. ...................... 439/329; 439/630
(58) Field of Classification Search ......... 439/326–329, 439/630
See application file for complete search history.

(56) References Cited
U.S. PATENT DOCUMENTS
1,744,979 A    1/1930    Matthes 6,250,934 B1    6/2001    Eskildsen et al.
2004/0235353 A1 *  11/2004    Katsumata et al. .......... 439/630
2006/0286846 A1 *  12/2006    Chen et al. .................. 439/325

FOREIGN PATENT DOCUMENTS

| CN | 1553409 A | 12/2004 |
|---|---|---|
| CN | 2735666 Y | 10/2005 |
| GB | 2360640 A | 9/2001 |
| JP | 2005-135305 | 5/2005 |

* cited by examiner

Primary Examiner—Renee Luebke
Assistant Examiner—Larisa Tsukerman
(74) Attorney, Agent, or Firm—Quintero Law Office

(57) ABSTRACT

A memory card fixing device including a base and two resilient fastening structures is disclosed. The resilient fastening structures are provided at the two opposite sides of the base. Each fastening structure has a guiding portion and a recess. A memory card slides into the recess along the guiding portion and can be fixed in the recess by the resilience of the fastening structures.

15 Claims, 4 Drawing Sheets

MOBILE PHONE AND MEMORY CARD FIXING DEVICE THEREOF

CROSS REFERENCE TO RELATED APPLICATIONS

This application claims priority of Taiwan Patent Application No. 096133222, filed on Sep. 6, 2007, the entirety of which is incorporated by reference herein.

BACKGROUND OF THE INVENTION

1. Field of the Invention

The invention relates to a fixing device and, more particularly, to a memory card fixing device for a mobile phone.

2. Description of the Related Art

Please refer to FIG. 1. A conventional memory card fixing device for a mobile phone mainly includes a foundation 10 and a rotating part 20 which is pivotally connected to the foundation 10 through a pivot 21. When a user wants to place a memory card, he can make the rotating part 20 slide along the Y axis and turn upward (as shown by the arrow direction in FIG. 1). Then, the memory card can be put into a slot 22 of the rotating part 20, and then the rotating part is closed to make the memory card electrically connected with a connector 11 of the mobile phone.

However, the conventional memory card fixing device has a complex design and a high cost, and the replacement of the memory card is also not convenient. Therefore, how to provide a preferred memory card fixing device becomes an important subject.

BRIEF SUMMARY OF THE INVENTION

One embodiment of the invention provides a memory card fixing device including a base and two resilient fastening structures which are provided at the two opposite sides of the base and are roughly symmetrical about a central axis of the base. Each fastening structure has a guiding portion a holding portion which forms a recess. The memory card slides into the recess along the guiding portion and is fixed in the recess via the resilience of the fastening structure.

In one preferred embodiment, the memory card fixing device is roughly ⊓-shaped.

In one preferred embodiment, the fastening structure is made of material.

In one preferred embodiment, the base is made of material.

In one preferred embodiment, the fastening structure and the base are integrally formed.

In one preferred embodiment, the memory card fixing device is a stainless steel sheet.

In one preferred embodiment, each fastening structure further includes a bearing portion which is connected to the base and the holding portion, wherein the bearing portion extends toward the central axis from the external side of the base to bear the memory card.

In one preferred embodiment, each fastening structure further includes a bending portion which is connected to the guiding portion and the holding portion, wherein the a first opening is formed between the bending portions of the two fastening structures, and the width of the first opening is less than the width of the memory card.

In one preferred embodiment of the invention, a second opening is formed between the bearing portions of the two fastening structures, and the width of the second opening is less than the width of the first opening.

The invention provides a memory card fixing device which not only has advantages such as low costs and convenient to use, but also can be widely applied to mobile phones or other electronic devices with memory cards.

These and other features, aspects, and advantages of the present invention will become better understood with regard to the following description, appended claims, and accompanying drawings.

DETAILED DESCRIPTION OF THE EMBODIMENTS

Figure 1:
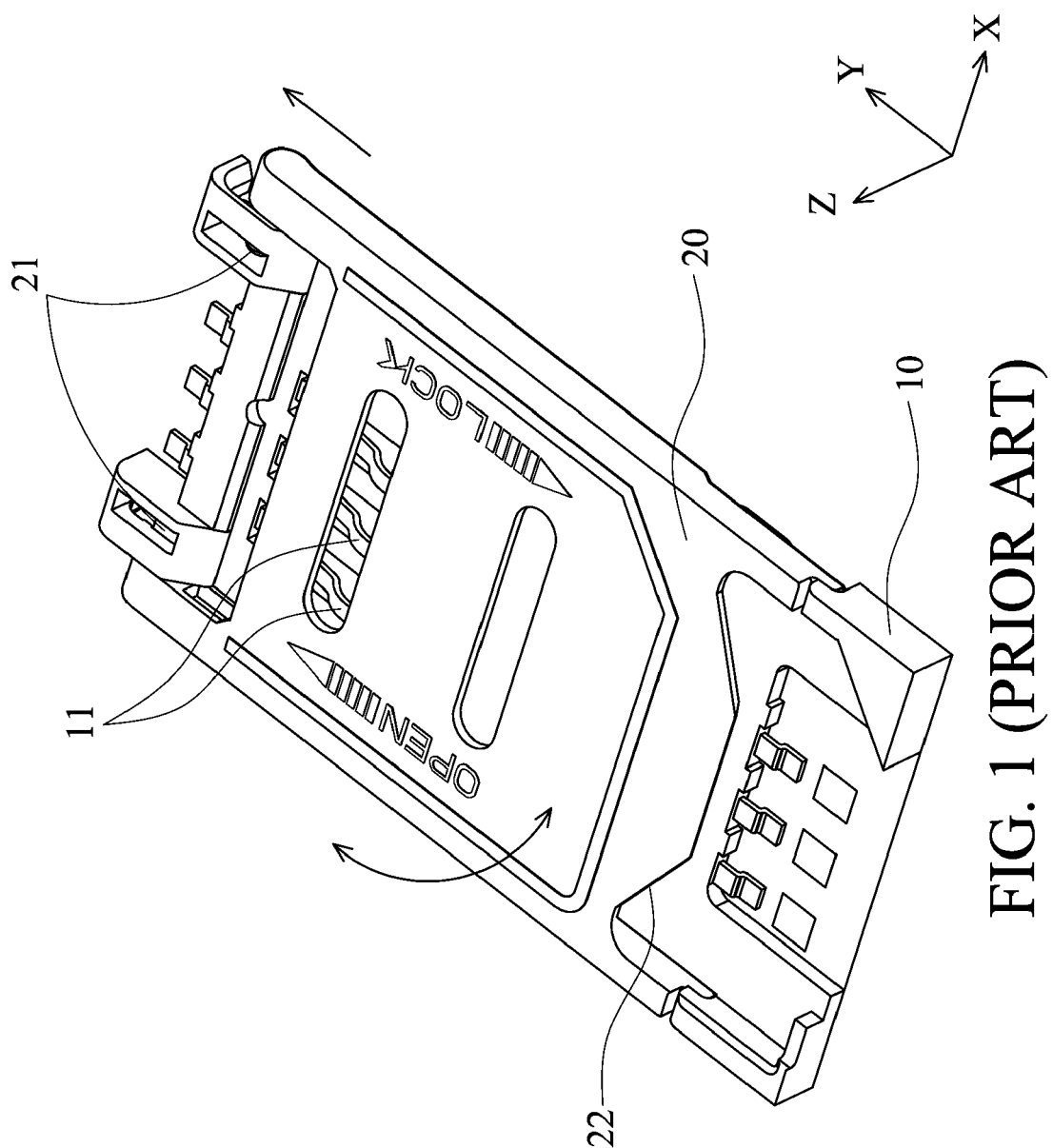
FIG. 1 is a schematic diagram showing a conventional memory card fixing device for a mobile phone.
Figure 2:
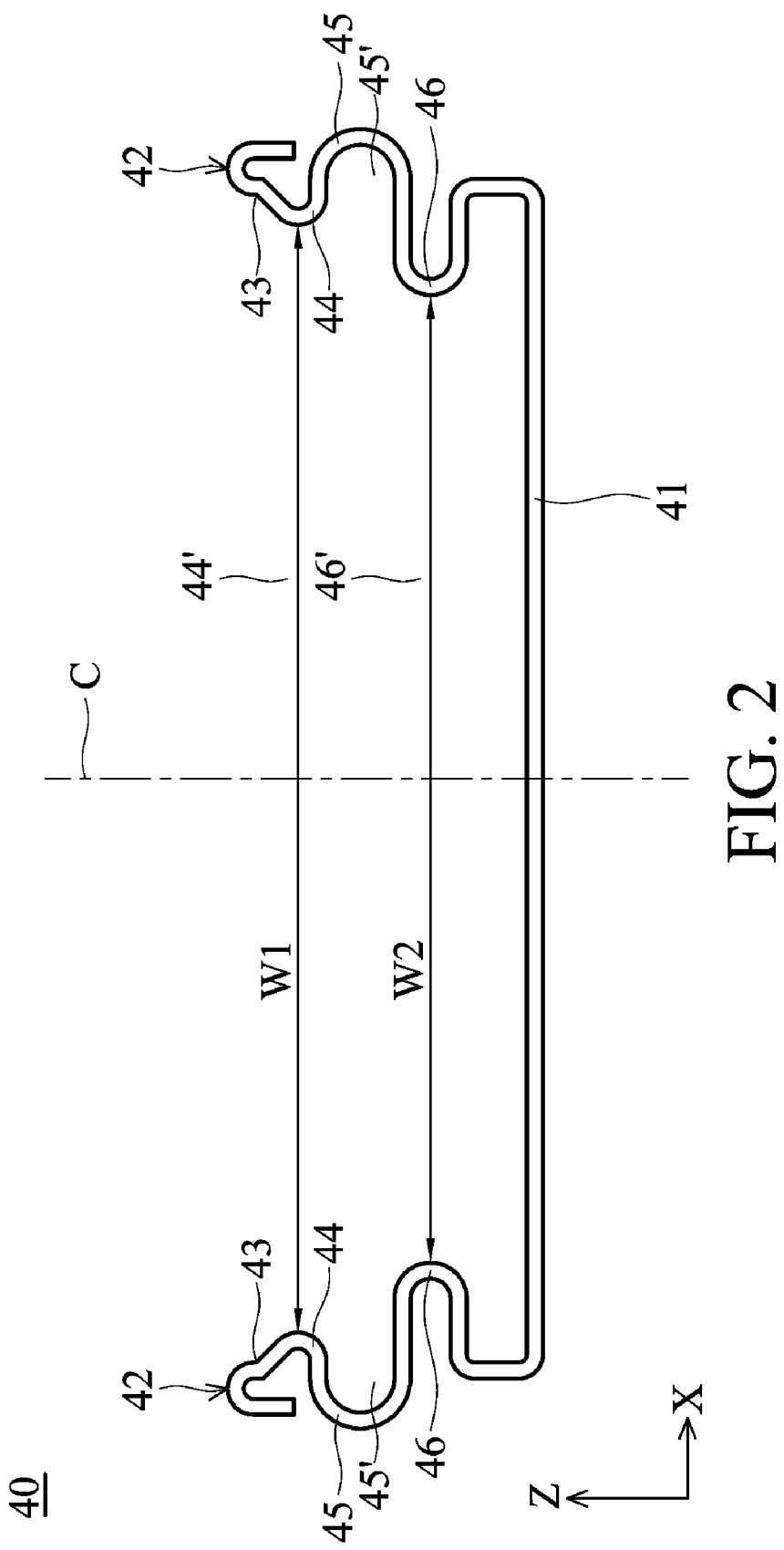
FIG. 2 is a schematic diagram showing a memory card fixing device according to an embodiment of the invention.
Figure 3:
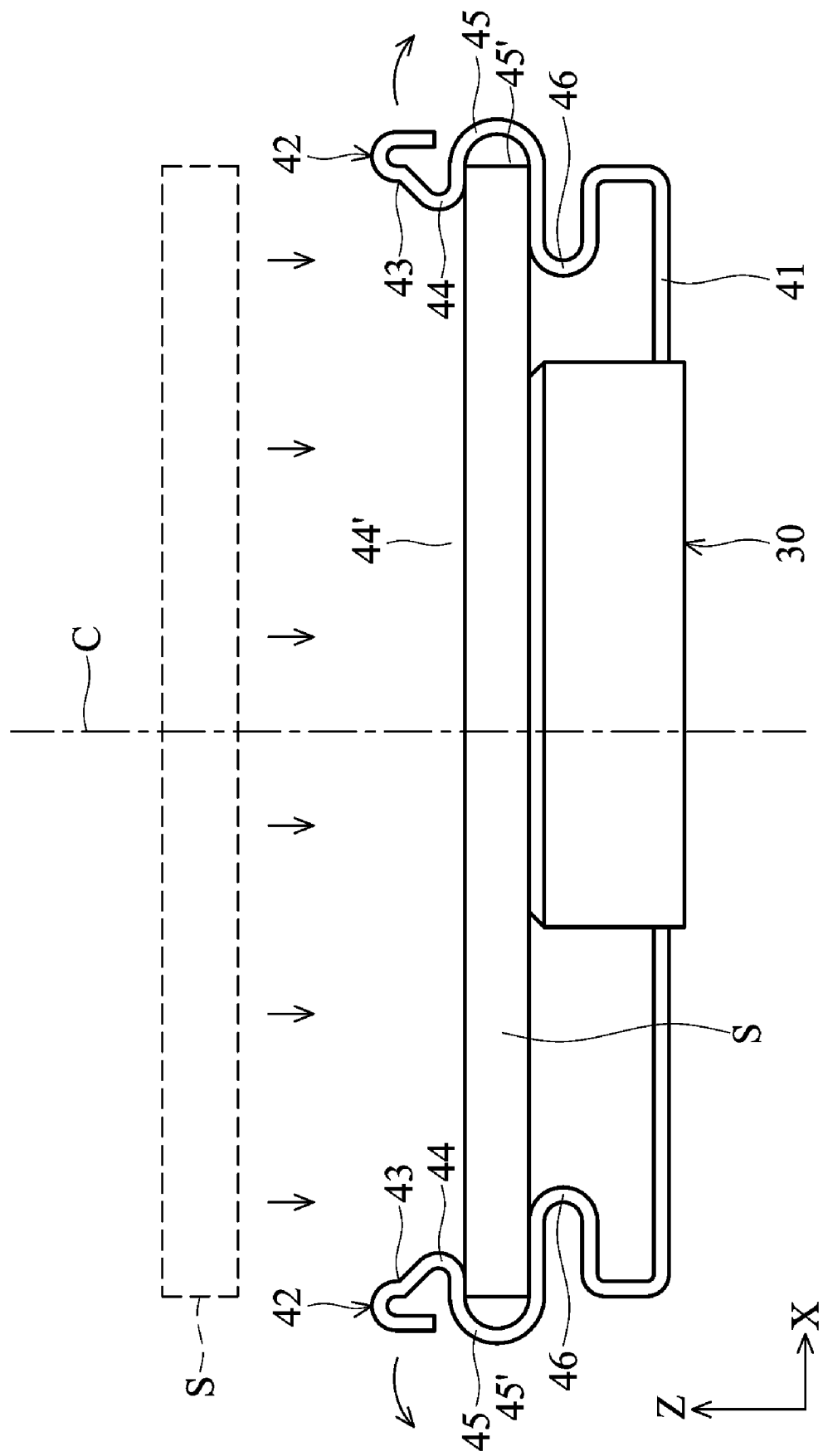
FIG. 3 is a schematic diagram showing a memory card electrically connected to a connector.

Please refer to FIG. 2 and FIG. 3 simultaneously. The memory card fixing device 40 of the embodiment can be provided in a mobile phone to fix a memory card S in a mobile phone and make the memory card S electrically connected to a connector 30 in the mobile phone (as shown in FIG. 3). The memory card S in the embodiment is, for example, a subscriber identity module (SIM) card.

As shown in FIG. 2, the memory card fixing device 40 is, for example, an integrally formed stainless steel sheet and mainly includes a base 41 and two resilient fastening structures 42. The two fastening structures 42 are roughly symmetrical about a central axis C of the base 41 and extend upward from the two sides of the base 41, respectively, to make the memory card fixing device 40 be ⊓-shaped roughly. However, the base 41 and the fastening structures 42 also can be made of other metals or flexible material besides the stainless steel. In addition, the base 41 and the fastening structure 42 can be connected to each other in a sticking manner or in an assembling manner to form the memory card fixing device 40.

In FIG. 2, each fastening structure 42 has a guiding portion 43, a bending portion 44, a holding portion 45 and a bearing portion 46, respectively. The bending portion 44 is connected to the guiding portion 43 and the holding portion 45. The bearing portion 46 is connected to the base 41 and the holding portion 45, wherein the bearing portion 46 extends toward the central axis C from the external side of the base 41 to support the memory card S. A first opening 44' is formed between the bending portions 44 of the two fastening structures 42, and a second opening 46' is formed between the bearing portions 46' of the two fastening structures 42, wherein the width W2 of the second opening 46' is less than the width W1 of the first opening 44'.

Figure 4:
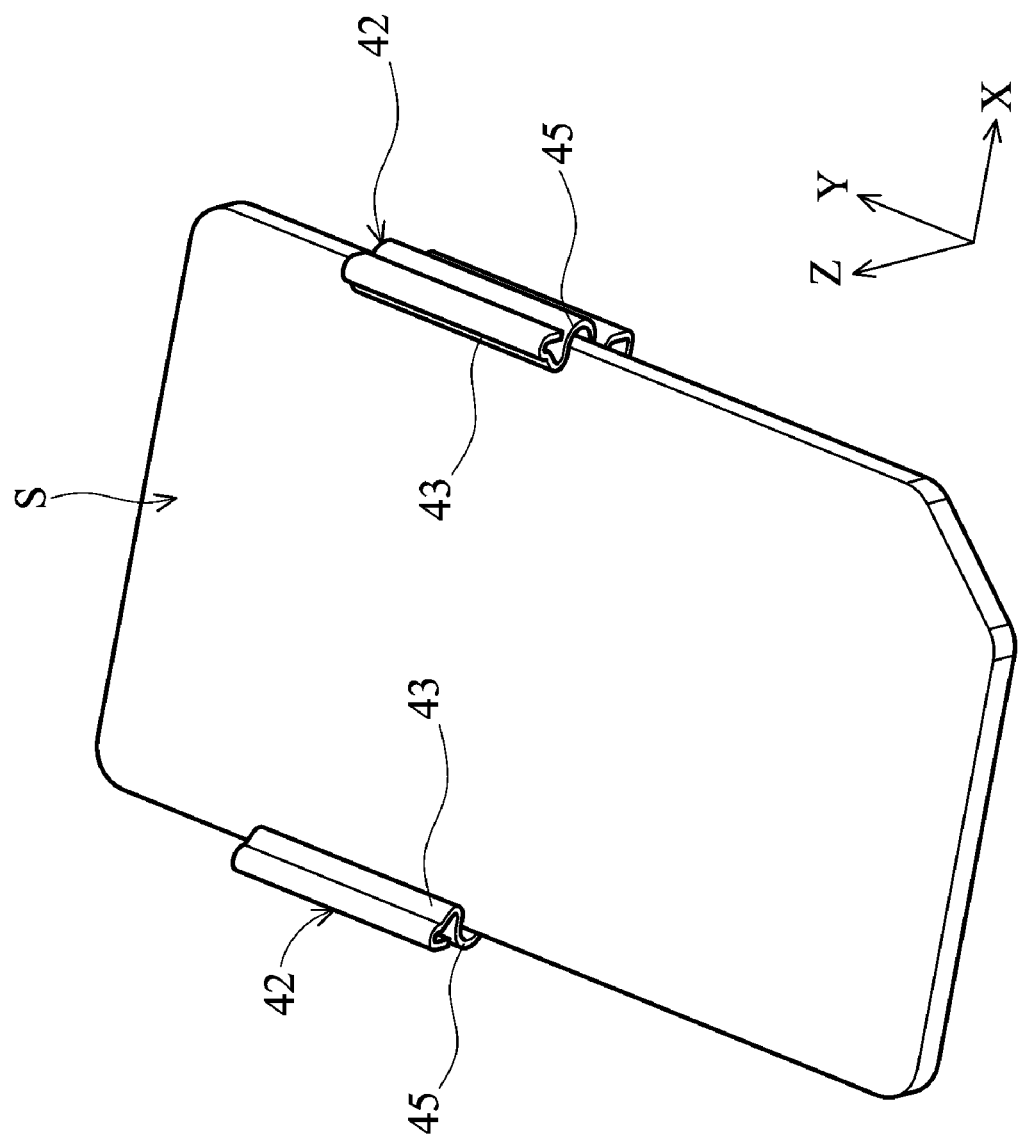
FIG. 4 is a schematic diagram showing a memory card fixed in the memory card fixing device.

Please refer to FIG. 3. In the embodiment, the memory card fixing device 40 is fixedly connected to a connector 30 in a mobile phone. When the memory card S needs to be placed, it can be pressed downward from the upper side of the memory card fixing device 40. Since the width of the first opening 44' is slightly less than the width of the memory card S, the memory card contacts with the guiding portions 43 and makes the two fastening structures 42 open outward (as shown by the arrow direction in FIG. 3) in the process of pressing the memory card. The memory card S can slides into the recess 45' formed by the holding portion 45 along the inclined plane of the guiding portions 43. The memory card S can be fixed in the recess 45' formed by the holding portion 45 via the resilience of the right and left two fastening structures 42 (as shown in FIG. 4), so that the memory card S can be electrically connected to the connector 30 steadily. On the contrary, when the memory card S needs to be taken out, a user can manually make the right and left two fastening structures 42 open outward to make the width W1 of the first opening 44' slightly greater than the width of the memory card S. At that moment, the bearing portions 46 at the bottom side of the recess 45' can push the memory card S out of the first opening 44' upward to make the memory card S separated from the memory card fixing device 40.

To sum up, the embodiment invention provides a memory card fixing device which not only has advantages such as low cost and convenient to use, but also can be widely applied to mobile phones or other electronic devices with memory cards.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A memory card fixing device comprising:
   a base; and
   two resilient fastening structures connected to the two opposite sides of the base, wherein each of the fastening structures has a guiding portion, a bending portion and a holding portion which forms a recess, and a memory card slides into the recess along the guiding portion and is fixed in the recess via the resilience of the fastening structure, wherein the bending portion connects the holding portion with the guiding portion, a first opening is formed between the bending portions of the fastening structures, and the width of the first opening is less than the width of the memory card.

2. The memory card fixing device according to claim 1, wherein the memory card fixing device is roughly U-shaped.

3. The memory card fixing device according to claim 1, wherein the fastening structures are made of metal.

4. The memory card fixing device according to claim 1, wherein the base is made of metal.

5. The memory card fixing device according to claim 1, wherein the fastening structures and the base are integrally formed.

6. The memory card fixing device according to claim 1, wherein each of the fastening structures further has a bearing portion connected to the base and the holding portion to support the memory card.

7. The memory card fixing device according to claim 6, wherein a second opening is formed between the bearing portions of the fastening structures, and the width of the second opening is less than the width of the first opening.

8. The memory card fixing device according to claim 1, wherein the memory card is a subscriber identity module (SIM) card.

9. A mobile phone comprising:
   a memory card fixing device comprising:
   a base; and
   two resilient fastening structures connected to the two opposite sides of the base, wherein each of the fastening structures has a guiding portion, a bending portion and a holding portion which forms a recess, and a memory card slides into the recess along the guiding portion and is fixed in the recess via the resilience of the fastening structure, wherein the bending portion connects the holding portion with the guiding portion, a first opening is formed between the bending portions of the fastening structures, and the width of the first opening is less than the width of the memory card.

10. The mobile phone according to claim 9, wherein the memory card fixing device is roughly U-shaped.

11. The mobile phone according to claim 9, wherein the fastening structures are made of metal.

12. The mobile phone according to claim 9, wherein the base is made of metal.

13. The mobile phone according to claim 9, wherein the fastening structures and the base are integrally formed.

14. The mobile phone according to claim 9, wherein each of the fastening structures further has a bearing portion connected to the base and the holding portion to support the memory card.

15. The mobile phone according to claim 14, wherein a second opening is formed between the bearing portions of the fastening structures, and the width of the second opening is less than the width of the first opening.

* * * * *